(12) United States Patent
Kakoi et al.

(10) Patent No.: US 9,831,647 B2
(45) Date of Patent: Nov. 28, 2017

(54) RECEIVING SECTION AND ELECTRICAL JUNCTION BOX WITH SAME

(71) Applicants: FURUKAWA ELECTRIC CO., LTD., Tokyo (JP); FURUKAWA AUTOMOTIVE SYSTEMS INC., Inukami-gun (JP); TOYOTA JIDOSHA KABUSHIKI KAISHA, Toyota-shi (JP)

(72) Inventors: Ryusuke Kakoi, Inukami-gun (JP); Satoshi Hirose, Inukami-gun (JP); Yasuhiro Yamazaki, Kariya (JP); Shinsuke Takagi, Kariya (JP)

(73) Assignees: FURUKAWA ELECTRIC CO., LTD., Tokyo (JP); FURUKAWA AUTOMOTIVE SYSTEMS INC., Inukami-gun (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/312,972

(22) PCT Filed: Jun. 5, 2015

(86) PCT No.: PCT/JP2015/002844
§ 371 (c)(1),
(2) Date: Nov. 21, 2016

(87) PCT Pub. No.: WO2015/190081
PCT Pub. Date: Dec. 17, 2015

(65) Prior Publication Data
US 2017/0187171 A1    Jun. 29, 2017

(30) Foreign Application Priority Data

Jun. 11, 2014    (JP) ................................ 2014-120064

(51) Int. Cl.
*H05K 5/02*    (2006.01)
*H02G 3/08*    (2006.01)
(Continued)

(52) U.S. Cl.
CPC ............. *H02G 3/08* (2013.01); *H05K 5/0204* (2013.01); *H05K 7/1401* (2013.01); *B60R 16/02* (2013.01)

(58) Field of Classification Search
CPC .......................... H05K 5/0204; H05K 7/1401
See application file for complete search history.

(56) References Cited

U.S. PATENT DOCUMENTS 7,255,597 B2 * 8/2007 Nakamura ........... H05K 5/0204
439/535
7,357,650 B2 * 4/2008 Sasaki .................... H01R 9/223
439/190
(Continued)

FOREIGN PATENT DOCUMENTS

JP    10-042429 A    2/1998
JP    2006-180598 A    7/2006
(Continued)

OTHER PUBLICATIONS

International Search Report dated Aug. 18, 2015, in PCT/JP2015/002844 filed Jun. 5, 2015.

*Primary Examiner* — Hung V Ngo
(74) *Attorney, Agent, or Firm* — Oblon, McClelland, Maier & Neustadt, L.L.P.

(57) ABSTRACT

A receiving part (2) has a substantially rectangular shape with short sides and long sides, and its short-side inner surface (15) is provided with a central latch claw (32) in a substantially central region thereof with respect to a short side direction, with side elastic latch portions (33) provided on both sides of the central latch claw (32) with respect to the short side direction. Each of the side elastic latch portions (33) includes a receiving-part rib (34), an elastic piece (35), and a side elastic latch claw (38). The receiving-part rib (34) protrudes from the short-side inner surface (15) and extends in the insertion direction. The elastic piece (35)

(Continued)

is arranged between the receiving-part rib (34) and a long-side inner surface ((17) or (18)), and elastically deformable. The side elastic latch claw (38) is formed on the elastic piece (35). The side elastic latch claw (38) has a latch surface (39) that faces in a first insertion direction, and the central latch claw (32) has a latch surface (40) that faces in a second insertion direction.

5 Claims, 14 Drawing Sheets

(51) Int. Cl.
  *H05K 7/14* (2006.01)
  *B60R 16/02* (2006.01)

(56) References Cited

U.S. PATENT DOCUMENTS

| | | | |
|---|---|---|---|
| 7,692,105 B2 * | 4/2010 | Clark | H05K 5/0204 174/559 |
| 9,591,774 B2 * | 3/2017 | Anami | B60R 16/0239 |
| 2004/0214458 A1 * | 10/2004 | Maebashi | H01H 9/10 439/76.2 |
| 2006/0186494 A1 * | 8/2006 | Apfelbacher | H05K 5/0204 257/415 |
| 2006/0243870 A1 * | 11/2006 | Ishiguro | H05K 5/0204 248/200 |
| 2008/0299800 A1 * | 12/2008 | Yoshida | H01R 13/5227 439/76.2 |
| 2009/0203236 A1 * | 8/2009 | Akahori | B60R 16/0238 439/76.1 |
| 2009/0298310 A1 * | 12/2009 | Nakanishi | H02G 3/088 439/76.2 |
| 2012/0134130 A1 | 5/2012 | Washihira et al. | |
| 2013/0240695 A1 * | 9/2013 | Chaung | H05K 5/0204 248/220.22 |
| 2015/0108287 A1 * | 4/2015 | Arai | H05K 5/0204 248/65 |

FOREIGN PATENT DOCUMENTS

| | | |
|---|---|---|
| JP | 2010-029011 A | 2/2010 |
| WO | WO 2011/004650 A1 | 1/2011 |

\* cited by examiner

C - C

D - D

E - E

F - F

G - G

RECEIVING SECTION AND ELECTRICAL JUNCTION BOX WITH SAME

TECHNICAL FIELD

The present invention relates to a configuration of a receiving part for receiving, for example, a relay module having a cassette-like configuration in an electrical junction box.

BACKGROUND ART

An electrical junction box (relay box), which is provided in an automobile or the like, has a component mounting surface on which components such as a relay are mountable. In a conventional electrical junction box, electrical components are mounted directly on the component mounting surface. Mounting electrical components directly on the electrical junction box, however, requires that design of the electrical junction box be changed each time the electrical component to be mounted is changed. This raises a problem that the electrical component to be mounted cannot easily be changed.

Recently, therefore, a configuration is sometimes adopted in which a unit having electrical components mounted thereon is detachably mounted to the electrical junction box in a cassette-like manner. With such a configuration, the electrical components to be mounted can be easily changed by changing the unit. This configuration is shown in, for example, Patent Documents 1 and 2.

The electrical junction box shown in Patent Document 1 includes a base with a mount to which either one of a relay block and a relay module is selectively mountable. According to Patent Document 1, the relay block and the relay module are configured to be compatible such that they are mountable on the same mount, and thus the relay block and the relay module can be used differently as appropriate, which enables a flexible design.

The electrical junction box shown in Patent Document 2 allows an electrical circuit unit to be inserted therein from the lower side of a receiving part (paragraph 0033 of Patent Document 2). The electrical junction box shown in Patent Document 2 allows the electrical circuit unit received in the receiving part to be taken out upward (paragraph 0035). The electrical junction box shown in Patent Document 2 also allows an electrical circuit unit to be inserted therein from the upper side of the receiving part (paragraph 0036).

PRIOR-ART DOCUMENTS

Patent Documents

Patent Document 1: International Publication No. 2011/004650

Patent Document 2: Japanese Patent Application Laid-Open No. 2006-180598

SUMMARY OF THE INVENTION

Problems to be Solved by the Invention

As described in paragraph 0029 of Patent Document 1, a wire is connected to a lower part of the relay block. This is why the relay block needs to be inserted from the lower side of the mount in order to attach the relay block to the mount (paragraph 0029). On the other hand, as described in paragraph 0041 of Patent Document 1, the relay module can be replaced for a maintenance operation by being taken out of the mount in the upward direction. This is why the relay module is inserted from the upper side of the mount in order to attach the relay module to the mount (paragraph 0033).

The mount of Patent Document 1 includes a block-purpose lock bearing engageable with the relay block and a module locking claw engageable with the relay module. The necessity to accept both the relay block inserted from the lower side and the relay module inserted from the upper side results in a complicated structure of the mount of Patent Document 1, which causes a cost increase of the electrical junction box. In addition, due to the complicated structure of the mount, it is difficult to make the mount compact, and the size of the electrical junction box increases.

The configuration shown in Patent Document 2 allows the electrical circuit unit to be inserted from both the upper and lower sides of the receiving part. The configuration shown in Patent Document 2 not only allows the electrical circuit unit to be inserted into the receiving part from both the upper and lower sides thereof but also allows the electrical circuit unit that has been received in the receiving part from the lower side thereof to be taken out in the upward direction. It is therefore considered that the configuration shown in Patent Document 2 has more flexibility than Patent Document 1.

In Patent Document 2, however, a latch piece, an engagement projection, a guide rib, and the like, are arranged dispersedly in the receiving part. This incurs a problem that the receiving part cannot be made compact to result in an increased size of the electrical junction box, which is the same problem as that of Patent Document 1.

The present invention has been made in view of the circumstances described above, and an object of the present invention is to achieve a compact configuration of a receiving part of an electrical junction box, the receiving part receiving a reception object and allowing the reception object to be inserted therein from both the upper and lower sides thereof.

Means for Solving the Problems and Effects Thereof

Problems to be solved by the present invention are as described above, and next, means for solving the problems and effects thereof will be described.

In a first aspect of the present invention, a receiving part having the following configuration is provided. The receiving part allows a reception object having a substantially rectangular parallelepiped shape to be inserted therein in a first insertion direction and in a second insertion direction opposite to the first insertion direction. The receiving part has an opening whose shape is substantially rectangular with short sides and long sides when seen in the insertion direction. The receiving part includes short-side inner surfaces defining the short sides of the rectangle and long-side inner surfaces defining the long sides of the rectangle. The short-side inner surface of the receiving part is provided with a central latch claw in a substantially central region thereof with respect to a short side direction that is a direction along the short side of the rectangle, and also provided with side elastic latch portions arranged on both sides of the central latch claw with respect to the short side direction. The side elastic latch portion includes a receiving-part rib, an elastic piece, and a side elastic latch claw. The receiving-part rib protrudes from the short-side inner surface and extends along the insertion direction. The elastic piece is arranged between the receiving-part rib and the long-side inner surface, and elastically deformable. The side elastic latch claw is formed on the elastic piece. The side elastic latch claw has a latch surface facing in the first insertion direction, and the central latch claw has a latch surface that faces in the second insertion direction. The reception object is fixed by the latch surface of the central latch claw, the latch surface of the side elastic latch claw, and the receiving-part rib being in contact with the reception object.

Providing the side elastic latch claw with the latch surface facing in the first insertion direction and the central latch claw with the latch surface facing in the second insertion direction enables the reception object to be fixed so as not to fall out in either of the first insertion direction nor the second insertion direction. The reception object can be inserted into the receiving part in both of the first insertion direction and the second insertion direction. The receiving-part rib being in contact with the reception object can prevent the reception object from rattling. Since the central latch claw and the side elastic latch portions are arranged side by side along the short side, there is no need to provide a latch claw and the like on the long side. Accordingly, the receiving part can be made compact.

Preferably, the above-described receiving part is configured as follows. The side elastic latch portion includes a bridge that connects the receiving-part rib to the long-side inner surface. The elastic piece included in the side elastic latch portion is elongated in the insertion direction. One longitudinal end portion of the elastic piece is connected to the short-side inner surface via a curved portion. The other longitudinal end portion of the elastic piece is connected to the bridge.

Providing the bridge that connects the receiving-part rib to the long-side inner surface leads to prevention of deformation of the receiving-part rib so that the strength of the receiving-part rib is improved. In addition, the strength of the elastic piece is ensured because the elastic piece is supported in a fixed-fixed manner as described above.

In a second aspect of the present invention, an electrical junction box including the above-described receiving part is provided.

Such an electrical junction box includes the receiving part with a compact configuration. Accordingly, the electrical junction box as a whole can be configured compactly.

Preferably, the above-described electrical junction box is configured as follows. The electrical junction box includes a reception object to be received in the receiving part. The reception object has a substantially rectangular shape when seen in the insertion direction, with short-side outer surfaces defining short sides of the rectangle and long-side outer surfaces defining long sides of the rectangle. The short-side outer surface of the reception object is provided with a central elastic latch portion in a substantially central region thereof with respect to the short side direction, and also provided with side latch claws arranged on both sides of the central elastic latch portion with respect to the short side direction. The central elastic latch portion includes two reception-object ribs, an elastic piece, and a central elastic latch claw. The reception-object ribs protrude from the short-side outer surface and extend in the insertion direction in parallel to each other. The elastic piece is arranged between the two reception-object ribs. The central elastic latch claw is formed on the elastic piece. The central elastic latch claw has a latch surface that faces in the first insertion direction, and the side latch claw has a latch surface that faces in the second insertion direction.

The reception object is fixed to the receiving part by: the latch surface of the central elastic latch claw being in contact with the latch surface of the central latch claw, and the latch surface of the side elastic latch claw being in contact with the latch surface of the side latch claw; a distal end of the reception-object rib being in contact with the short-side inner surface; and the reception-object rib being in contact with the receiving-part rib with respect to the short side direction.

The latch claw of the receiving part and the latch claw of the reception object being engaged in this manner enables the reception object to be appropriately fixed. In addition, the distal ends of the reception-object ribs being in contact with the short-side inner surface of the receiving part can reduce rattling of the reception object with respect to the long side direction. Moreover, the reception-object rib being in contact with the receiving-part rib with respect to the short side direction can reduce rattling of the reception object with respect to the short side direction. Accordingly, in the above-described configuration, the mechanism for fixing the reception object and reducing rattling thereof can be collectively and compactly arranged on the short side.

Preferably, the above-described electrical junction box is configured as follows. The central elastic latch portion includes a bridge that connects the two reception-object ribs to each other. The elastic piece included in the central elastic latch portion is elongated in the insertion direction. One longitudinal end portion of the elastic piece is connected to the short-side outer surface via a curved portion. The other longitudinal end portion of the elastic piece is connected to the bridge.

Providing the bridge that connects the two reception-object ribs to each other leads to prevention of deformation of the reception-object ribs so that the strength of the reception-object ribs is improved. In addition, the strength of the elastic piece is ensured because the elastic piece is supported in a fixed-fixed manner.

EMBODIMENT FOR CARRYING OUT THE INVENTION

Figure 1:
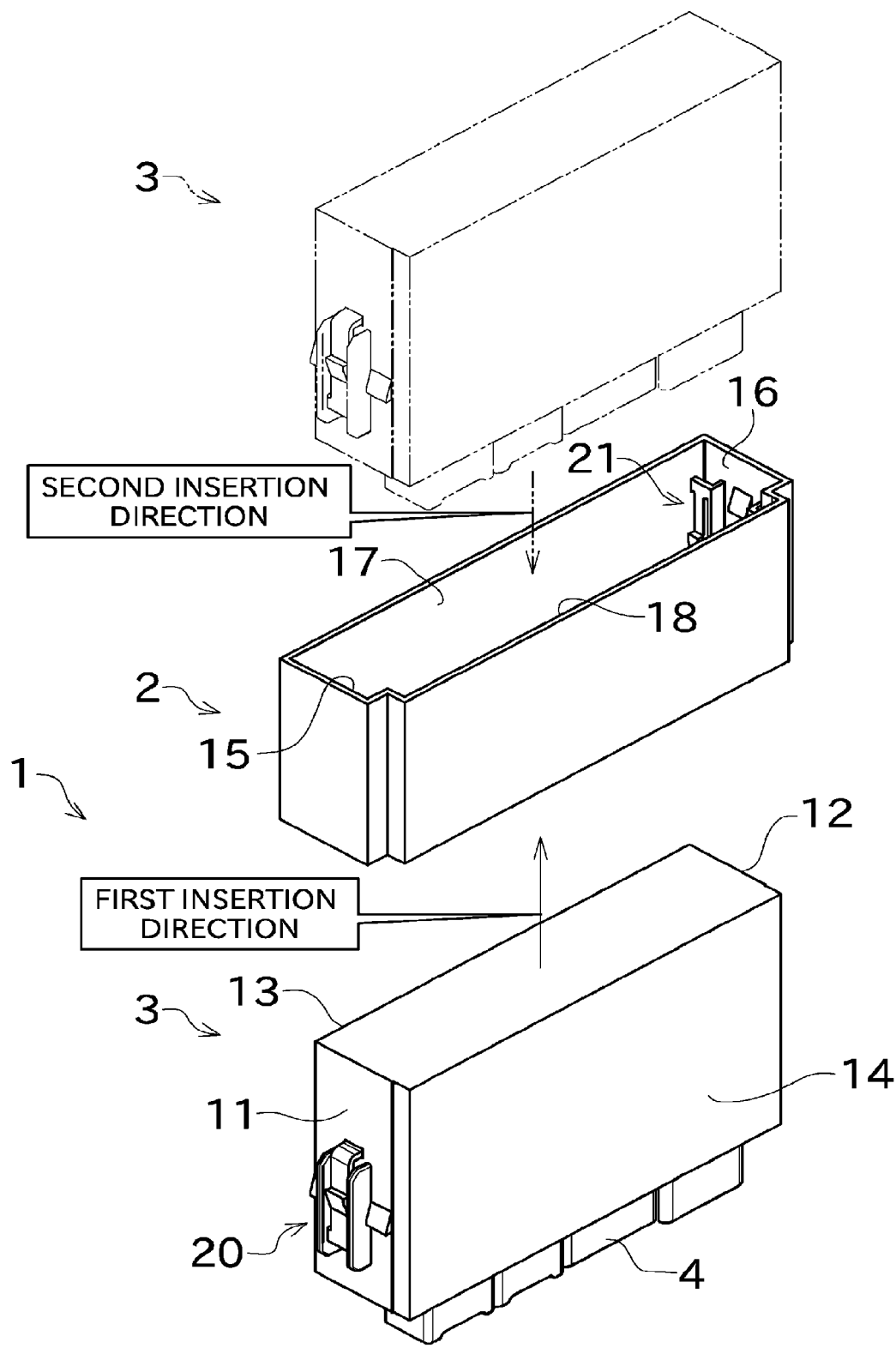
FIG. 1 A perspective view showing a relay module and a receiving part included in an electrical junction box according to an embodiment.

Next, an embodiment of the present invention will be described with reference to the drawings. FIG. 1 is a perspective view showing a structure of receiving a relay module (reception object) 3 in an electrical junction box 1 according to this embodiment.

The electrical junction box 1 of this embodiment includes a base body, and an upper casing for covering the upper side of the base body, and a lower casing for covering the lower side of the base body. Here, an electrical junction box including a base body, an upper casing, and a lower casing is known as shown in, for example, Patent Document 1, and therefore illustration thereof may be omitted as appropriate.

The base body, which is made of a synthetic resin, includes a component mounting surface on which various types of electrical components are mountable. The component mounting surface is arranged in a substantially horizontal manner such that the side on which components are to be mounted faces upward. In the description given below, the direction in which the component mounting surface faces will be referred to as "upward" and the direction opposite thereto will be referred to as "downward". This expression is merely for convenience of description, and not intended to limit the arrangement of the electrical junction box.

The upper casing, which is arranged above the base body, covers the upper side of the component mounting surface. The lower casing, which is arranged below the base body, covers the lower side of the base body. A wire harness connected to an external device and a connector or the like attached to the distal end of the wire harness are received in the lower casing.

The relay module 3 includes a housing made of a resin. The housing has a substantially rectangular parallelepiped shape, as shown in FIG. 1. A relay board having a plurality of relays mounted thereon is received in the housing. The housing is provided, in its lower part, with a connector 4 for connecting the wire harness to the relay board received in the housing.

The base body (not shown) of the electrical junction box 1 is provided with a receiving part 2 for receiving the relay module 3. Although FIG. 1 illustrates the receiving part 2 alone, the receiving part 2 is normally formed integral with the base body. Since the base body is made of a synthetic resin as mentioned above, the receiving part 2 is also made of the synthetic resin. The receiving part 2 has a substantially rectangular parallelepiped space such that the relay module 3 having a rectangular parallelepiped shape can be received therein.

In this embodiment, as illustrated with the solid line in FIG. 1, the relay module 3 can be inserted from the lower side of the receiving part 2. The direction (upper direction) of such insertion of the relay module 3 into the receiving part 2 will be referred to as a first insertion direction. In this embodiment, as illustrated with the chain line in FIG. 1, the relay module 3 can be inserted also from the upper side of the receiving part 2. The direction (lower direction) of such insertion of the relay module 3 into the receiving part 2 will be referred to as a second insertion direction. In the description given below, simply by "insertion direction", a direction parallel to the direction of insertion of the relay module 3 is meant regardless of whether it is the upper direction or the lower direction.

Figure 2:
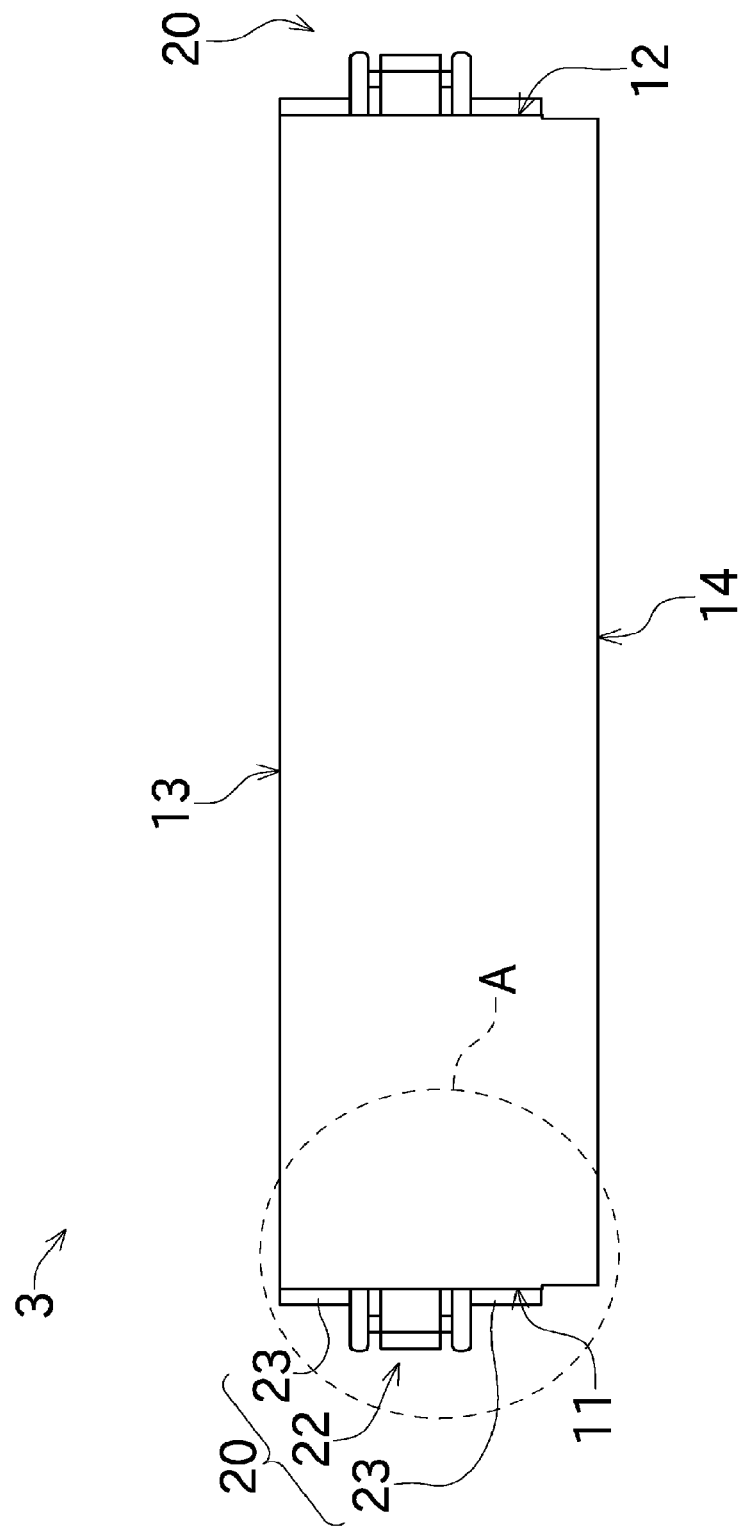
FIG. 2 A plan view of the relay module.
Figure 3:
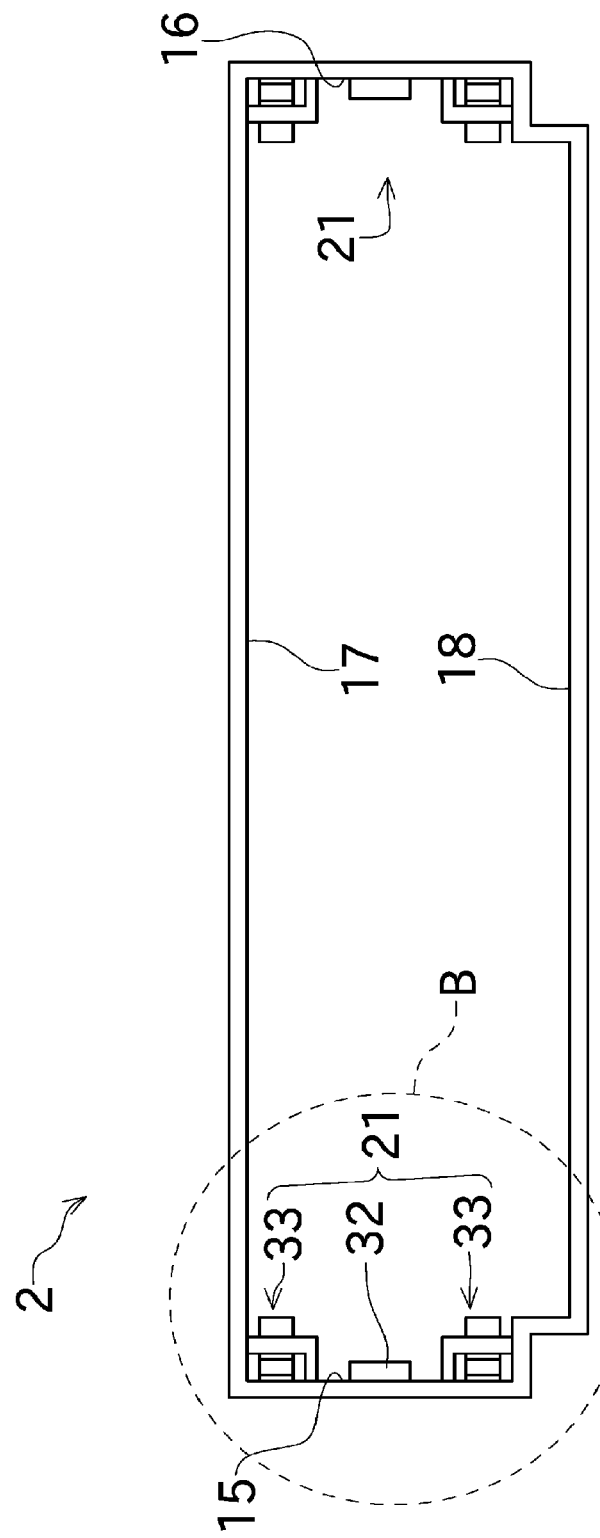
FIG. 3 A plan view of the receiving part.

As shown in FIG. 2, the relay module 3 has a substantially rectangular shape when seen in the insertion direction. Accordingly, the receiving part 2 in which the relay module 3 is inserted has a substantially rectangular opening when seen in the insertion direction (FIG. 3). In the description given below, the terms "short side" and "long side" are based on the rectangle observed when the relay module 3 and the receiving part 2 are seen in the insertion direction.

Referring to FIG. 2, the housing of the relay module 3 has an outer surface, of which faces defining the short sides of the rectangle will be referred to as a first short-side outer surface 11 and a second short-side outer surface 12. Of the outer surface of the housing of the relay module 3, faces defining the long sides of the rectangle will be referred to as a first long-side outer surface 13 and a second long-side outer surface 14.

Referring to FIG. 3, the receiving part 2 has an inner surface, of which faces defining the short sides of the rectangle will be referred to as a first short-side inner surface 15 and a second short-side inner surface 16. Of the inner surface of the receiving part 2, faces defining the long sides of the rectangle will be referred to as a first long-side inner surface 17 and a second long-side inner surface 18.

As shown in FIGS. 1 and 2, the relay module 3 is provided with reception-object engaging portions 20. As shown in FIGS. 1 and 3, the receiving part 2 is provided therein with receiving-part engaging portions 21. Inserting the relay module 3 into the receiving part 2 brings the reception-object engaging portions 20 into engagement with the receiving-part engaging portions 21, so that the relay module 3 is fixed to the receiving part 2.

Next, the reception-object engaging portions 20 of the relay module 3 will be described.

As shown in FIG. 2, the reception-object engaging portions 20 are formed on the respective outer surfaces (short-side outer surfaces 11, 12) that define the short sides of the relay module 3. The two reception-object engaging portions 20 provided in the relay module 3 have the same shape. In the following, therefore, a description will be given of the reception-object engaging portion 20 (the portion A in FIG. 2) formed on the first short-side outer surface 11, and a description of the reception-object engaging portion 20 formed on the second short-side outer surface 12 may be omitted.

Figure 4:
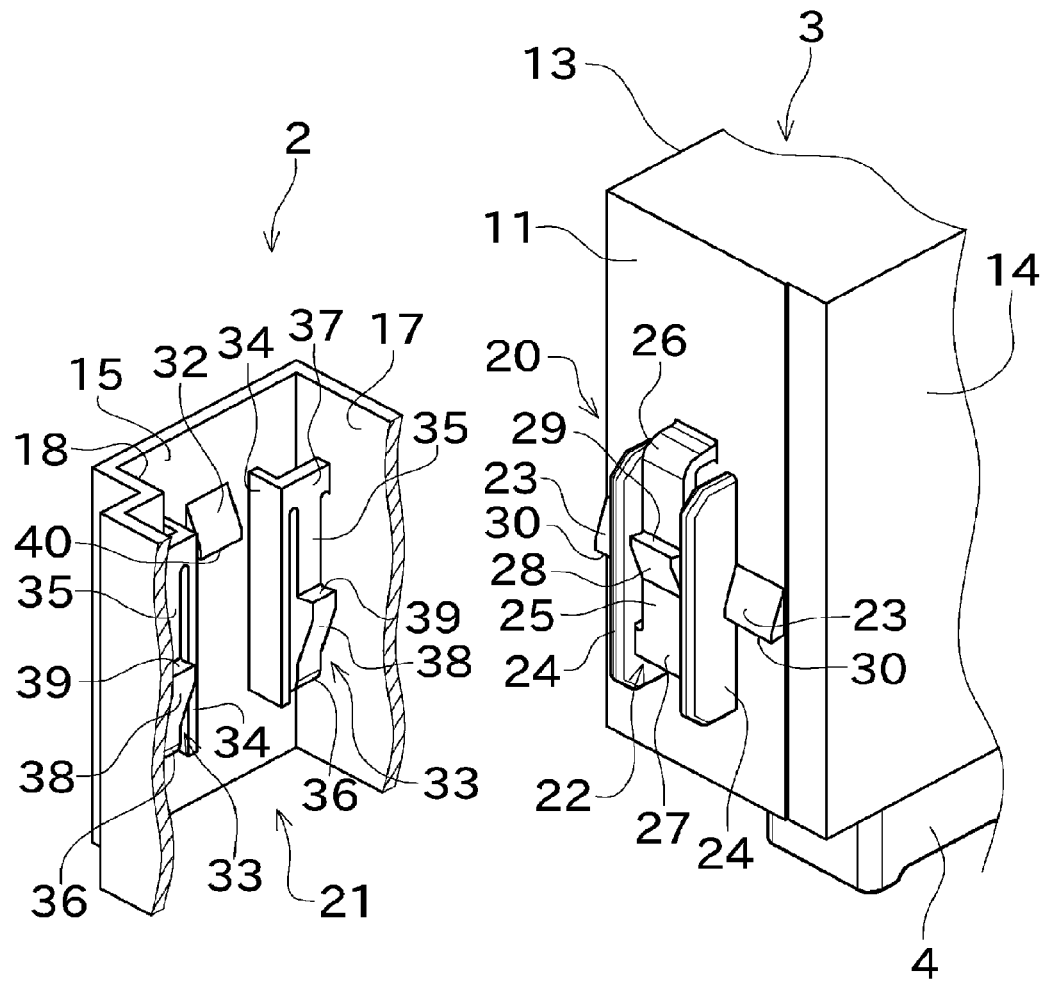
FIG. 4 A perspective view showing a receiving-part latch portion and a reception-object latch portion.

FIGS. 4 to 7 illustrate the reception-object engaging portion 20 of the first short-side outer surface 11 and therearound. Referring to FIG. 4, the reception-object engaging portion 20 includes a central elastic latch portion 22 and two side latch claws 23.

Figure 5:
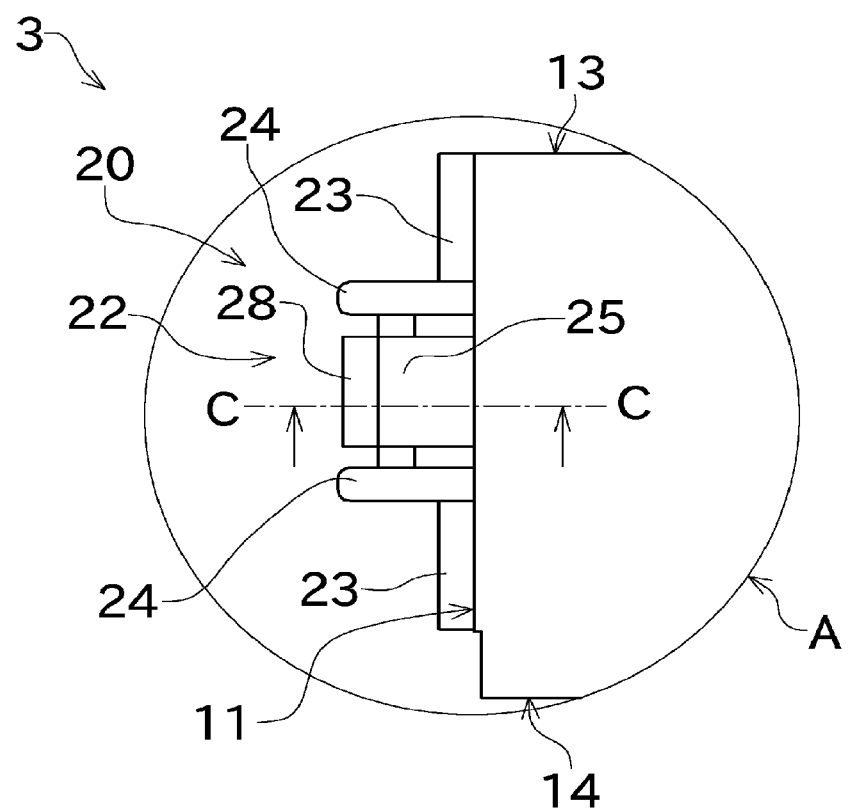
FIG. 5 A plan view showing the part A of FIG. 2 on an enlarged scale.
Figure 6:
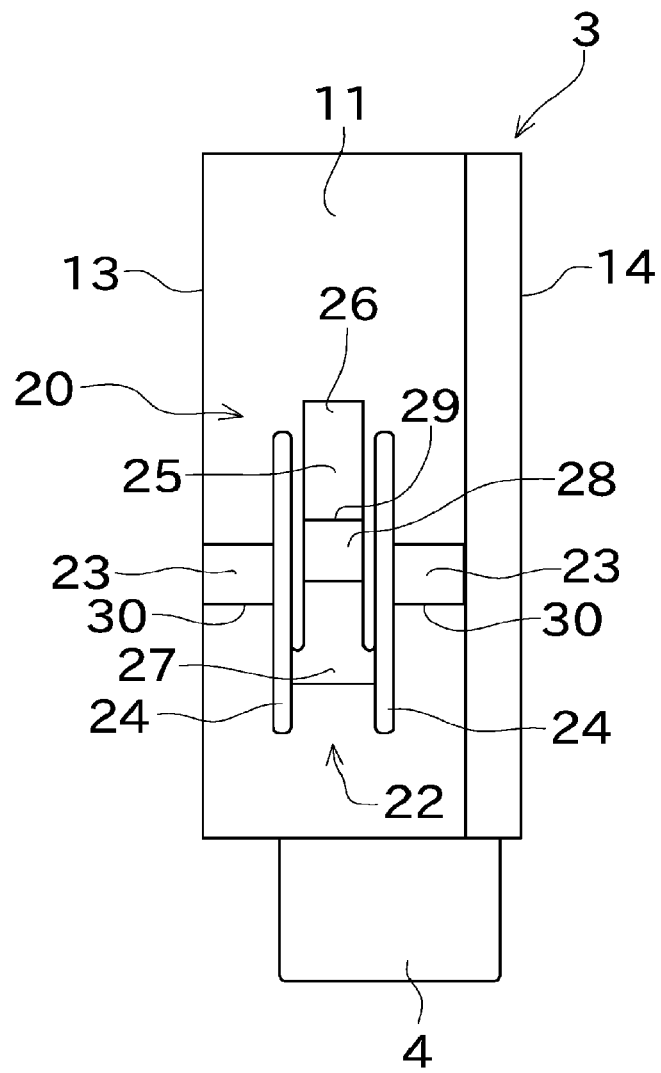
FIG. 6 A side view of the relay module.

As shown in FIGS. 5 and 6, the central elastic latch portion 22 is arranged in a substantially central region of the first short-side outer surface 11 of the relay module 3 with respect to a direction along the short side of the rectangle (with respect to the vertical direction in FIG. 5 or the horizontal direction in FIG. 6, which hereinafter may be also referred to as a short side direction).

As shown in FIGS. 5 and 6, the central elastic latch portion 22 includes two reception-object ribs 24. The reception-object ribs 24 are formed so as to protrude from the first short-side outer surface 11 and extend in the insertion direction (the vertical direction in FIG. 6). Thus, each of the reception-object ribs 24 is configured as a plate-like member parallel to the long-side outer surfaces 13, 14 (see FIG. 4). The two reception-object ribs 24 are arranged opposed to each other. A face of each one of the reception-object ribs 24 facing the other reception-object rib 24 will be referred to as an interior surface. A face of each of the reception-object ribs 24 opposite to its interior surface will be referred to as an exterior surface.

Referring to FIGS. 4 and 6, a bridge 27 is provided between the two reception-object ribs 24 so as to connect the interior surfaces to each other. Providing the bridge 27 contributes to an improved strength of the reception-object ribs 24.

Referring to FIGS. 5 and 6, an elastic piece 25 is arranged in a position between the two reception-object ribs 24.

Figure 7:
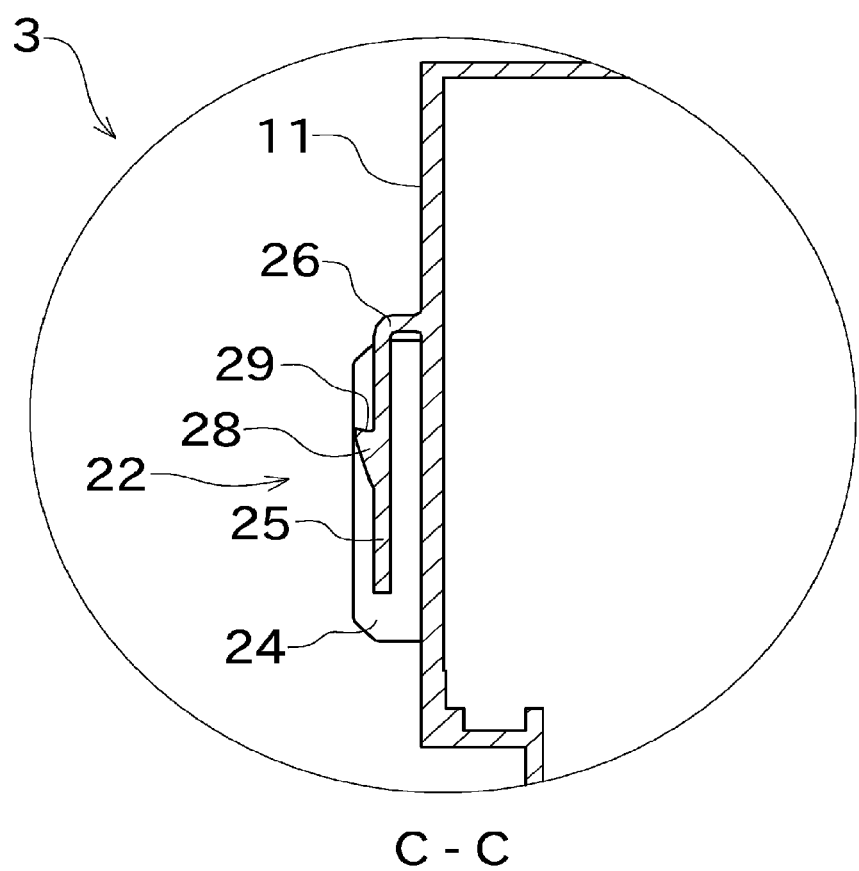
FIG. 7 A cross-sectional view as taken along the line C-C and seen along the arrows of FIG. 5.

The elastic piece 25, which is arranged substantially in parallel to a wall surface of the first short-side outer surface 11, has a shape elongated in the insertion direction. A cross-section of the elastic piece 25 is shown in FIG. 7. Referring to FIG. 7, one longitudinal end portion (in this embodiment, the upper end portion) of the elastic piece 25 is connected to the first short-side outer surface 11 via a curved portion 26. In this manner, the elastic piece 25 is formed integral with the housing of the relay module 3. Since the housing is made of a synthetic resin, the elastic piece 25 is also made of the synthetic resin. Thus, the elastic piece 25 having an elongated shape is capable of some elastic deformation.

Referring to FIG. 7, an end portion of the elastic piece 25 opposite to the curved portion 26 is not connected to the first short-side outer surface 11. That is, the other longitudinal end portion of the elastic piece 25 is a free end, which makes it easy to form the elastic piece 25.

A configuration in which the other longitudinal end portion of the elastic piece 25 is not supported (in which the elastic piece 25 is supported in a cantilevered manner) involves a risk that the elastic piece 25 causes plastic deformation when a force is applied to the elastic piece 25. In this embodiment, as shown in FIG. 6, the end portion of the elastic piece 25 opposite to the curved portion 26 is connected to the bridge 27 mentioned above. This can ensure a strength of the elastic piece 25 because the elastic piece 25 is supported in a fixed-fixed manner.

As shown in FIGS. 4 to 7, the elastic piece 25 has a central elastic latch claw 28 integrally formed therewith. The central elastic latch claw 28 is capable of elastic movement in the direction along the long side of the rectangle (in the horizontal direction in FIGS. 5 and 7, which hereinafter may be also referred to as a long side direction). As shown in FIG. 7, the central elastic latch claw 28 has a latch surface 29 facing in the first insertion direction (in this embodiment, upward).

Referring to FIGS. 5 and 6, the side latch claws 23 mentioned above are provided on the first short-side outer surface 11 of the relay module 3 and arranged on both sides of the central elastic latch portion 22 with respect to the short side direction (with respect to the vertical direction in FIG. 5 or the horizontal direction in FIG. 6). The two side latch claws 23 have the same shape. In the following, therefore, a description will be given of only one of the side latch claws 23, and a description of the other may be omitted.

The side latch claw 23 is fixed to the first short-side outer surface 11. The side latch claw 23 has a latch surface 30 facing in the direction (which is the second insertion direction or, in this embodiment, downward) opposite to the direction in which the latch surface 29 of the central elastic latch claw 28 faces.

Next, the receiving-part engaging portions 21 of the receiving part 2 will be described.

As shown in FIG. 3, the receiving-part engaging portions 21 are formed on the respective inner surfaces (short-side inner surfaces 15, 16) that define the short sides of the receiving part 2. Thus, the two receiving-part engaging portions 21 are arranged opposed to each other with respect to the long side direction. The two receiving-part engaging portions 21 provided in the receiving part 2 have the same shape. In the following, therefore, a description will be given of the receiving-part engaging portion 21 (the portion B in FIG. 3) formed on the first short-side inner surface 15, and a description of the receiving-part engaging portion 21 formed on the second short-side inner surface 16 may be omitted.

FIGS. 4 and 8-10 illustrate the receiving-part engaging portion 21 of the first short-side inner surface 15 and therearound. Referring to FIG. 4 and the like, the receiving-part engaging portion 21 includes a central latch claw 32 and two side elastic latch portions 33.

Figure 8:
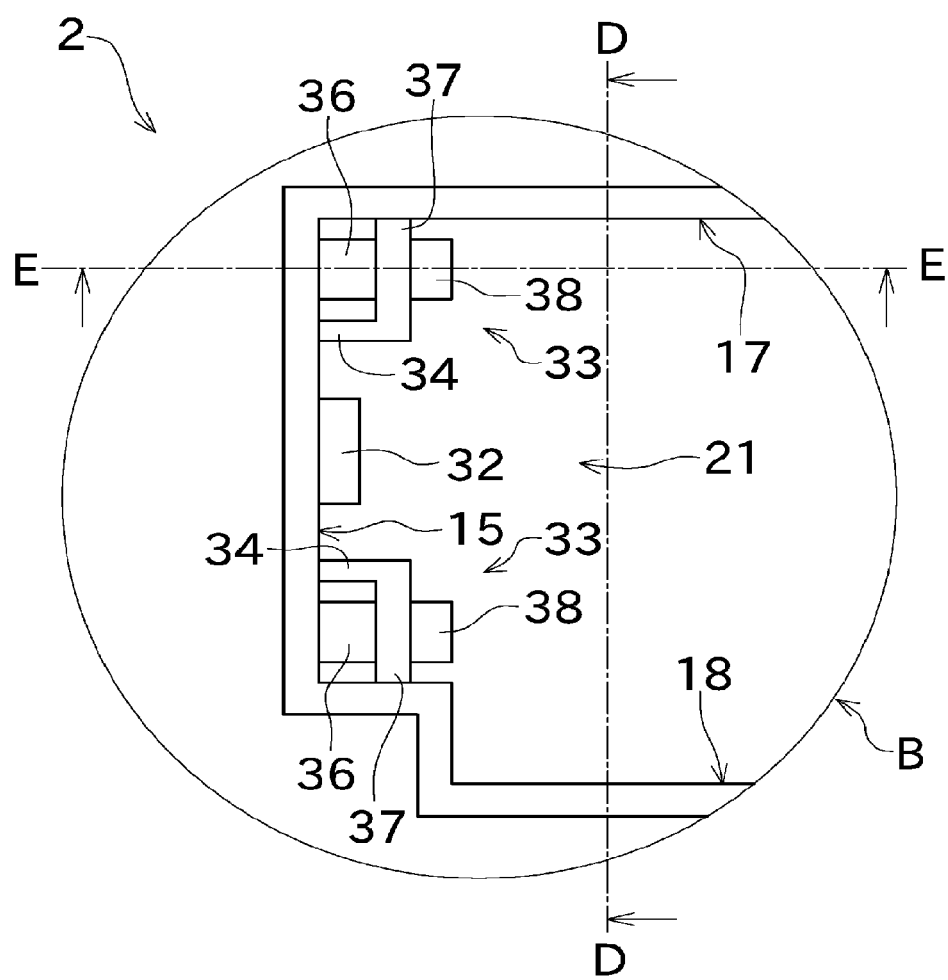
FIG. 8 A plan view showing the part B of FIG. 3 on an enlarged scale.
Figure 9:
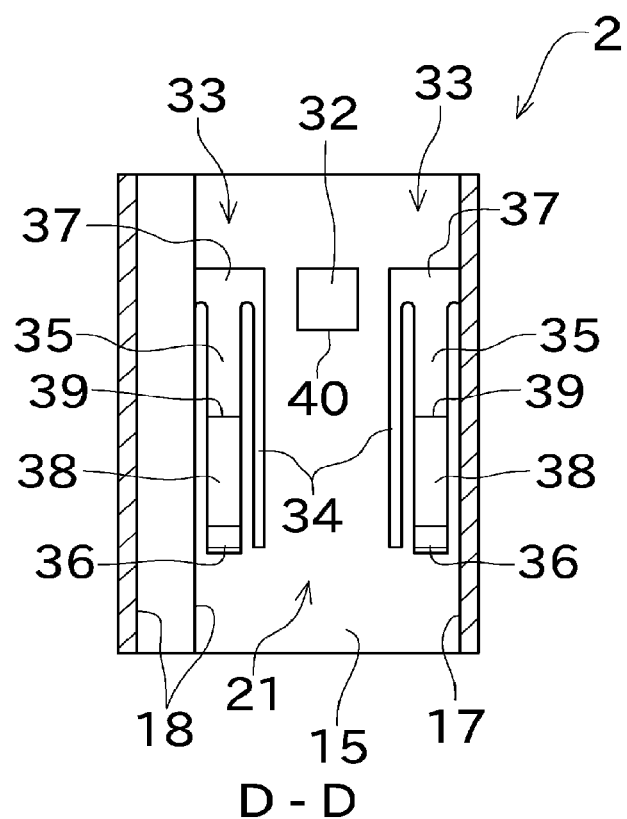
FIG. 9 A cross-sectional view as taken along the line D-D and seen along the arrows of FIG. 8.

As shown in FIGS. 8 and 9, the side elastic latch portions 33 are provided on the first short-side inner surface 15 of the receiving part 2 and arranged in both side portions thereof with respect to the short side direction (in the vertical direction in FIG. 5 or the horizontal direction in FIG. 6). The two side elastic latch portions 33 have substantially the same configuration. In the following, therefore, a description will be given of only one of the side elastic latch portions 33, and a description of the other may be omitted.

As shown in FIGS. 8 and 9, each of the side elastic latch portions 33 includes a receiving-part rib 34. The receiving-part rib 34 is provided so as to protrude from the first short-side inner surface 15 and extend in the insertion direction (the vertical direction in FIG. 9). Thus, the receiving-part rib 34 is configured as a plate-like member parallel to the long-side inner surfaces 17, 18 (see FIG. 4). The two receiving-part ribs 34 of the receiving-part engaging portion 21 are arranged opposed to each other. A face of each one of the receiving-part ribs 34 facing the other receiving-part rib 34 will be referred to as an interior surface. A face of each of the receiving-part ribs 34 opposite to its interior surface will be referred to as an exterior surface.

Referring to FIGS. 4 and 9, a bridge 37 is arranged so as to connect the exterior surface of the receiving-part rib 34 to the long-side inner surface (17 or 18). Providing the bridge 37 contributes to an improved strength of the receiving-part rib 34.

Referring to FIGS. 8 and 9, an elastic piece 35 is arranged in a position between the exterior surface of the receiving-part rib 34 and the long-side inner surface (17 or 18).

Figure 10:
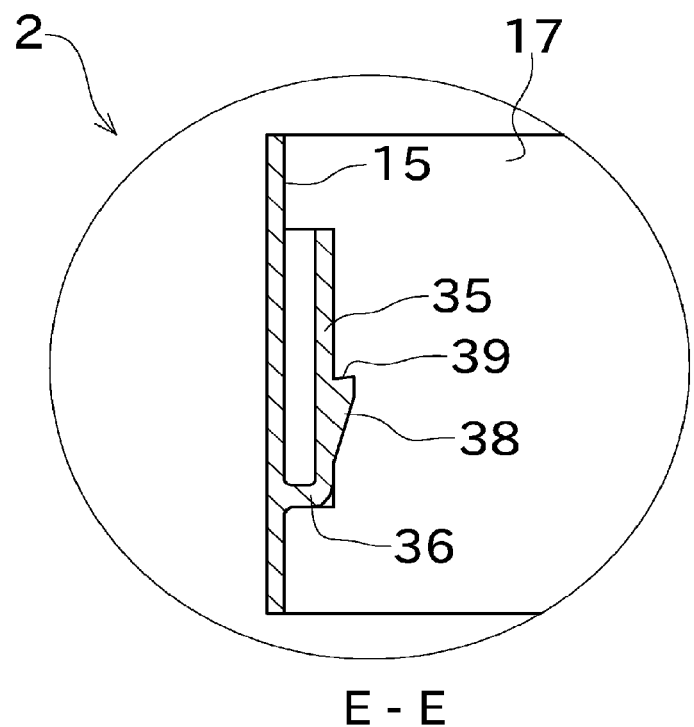
FIG. 10 A cross-sectional view as taken along the line E-E and seen along the arrows of FIG. 8.

The elastic piece 35, which is arranged substantially in parallel to a wall surface of the first short-side inner surface 15, has a shape elongated in the insertion direction. A cross-section of the elastic piece 35 is shown in FIG. 10. Referring to FIG. 10, one longitudinal end portion (in this embodiment, the lower end portion) of the elastic piece 35 is connected to the first short-side inner surface 15 via a curved portion 36. In this manner, the elastic piece 35 is formed integral with the first short-side inner surface 15 of the receiving part 2. Since the receiving part 2 is made of a synthetic resin, the elastic piece 35 is also made of the synthetic resin. Thus, the elastic piece 35 having an elongated shape is capable of some elastic deformation.

Referring to FIG. 10, an end portion of the elastic piece 35 opposite to the curved portion 36 is not connected to the first short-side inner surface 15. That is, the other longitudinal end portion of the elastic piece 35 is a free end, which makes it easy to form the elastic piece 35.

A configuration in which the other longitudinal end portion of the elastic piece 35 is not supported (in which the elastic piece 35 is supported in a cantilevered manner) involves a risk that the elastic piece 35 causes plastic deformation when a force is applied to the elastic piece 35. In this embodiment, as shown in FIG. 9, the end portion of the elastic piece 35 opposite to the curved portion 36 is connected to the bridge 37 mentioned above. This can ensure a strength of the elastic piece 35 because the elastic piece 35 is supported in a fixed-fixed manner.

As shown in FIGS. 4, 9, and 10, the elastic piece 35 has a side elastic latch claw 38 integrally formed therewith. The side elastic latch claw 38 is capable of elastic movement in the long side direction (in the horizontal direction in FIGS. 8 and 10). As shown in FIG. 10, the side elastic latch claw 38 has a latch surface 39 facing in the first insertion direction (in this embodiment, upward).

Referring to FIGS. 8 and 9, the central latch claw 32 mentioned above is arranged in a substantially central region of the first short-side inner surface 15 of the receiving part 2 with respect to the short side direction (with respect to the vertical direction in FIG. 8 or the horizontal direction in FIG. 9). As shown in FIGS. 8 and 9, the central latch claw 32 is positioned between the two side elastic latch portions 33 with respect to the short side direction. The central latch claw 32 is fixed to the first short-side inner surface 15. The central latch claw 32 has a latch surface 40 facing in the direction (which is the second insertion direction or, in this embodiment, downward) opposite to the direction in which the latch surface 39 of the side elastic latch claw 38 faces.

Figure 11:
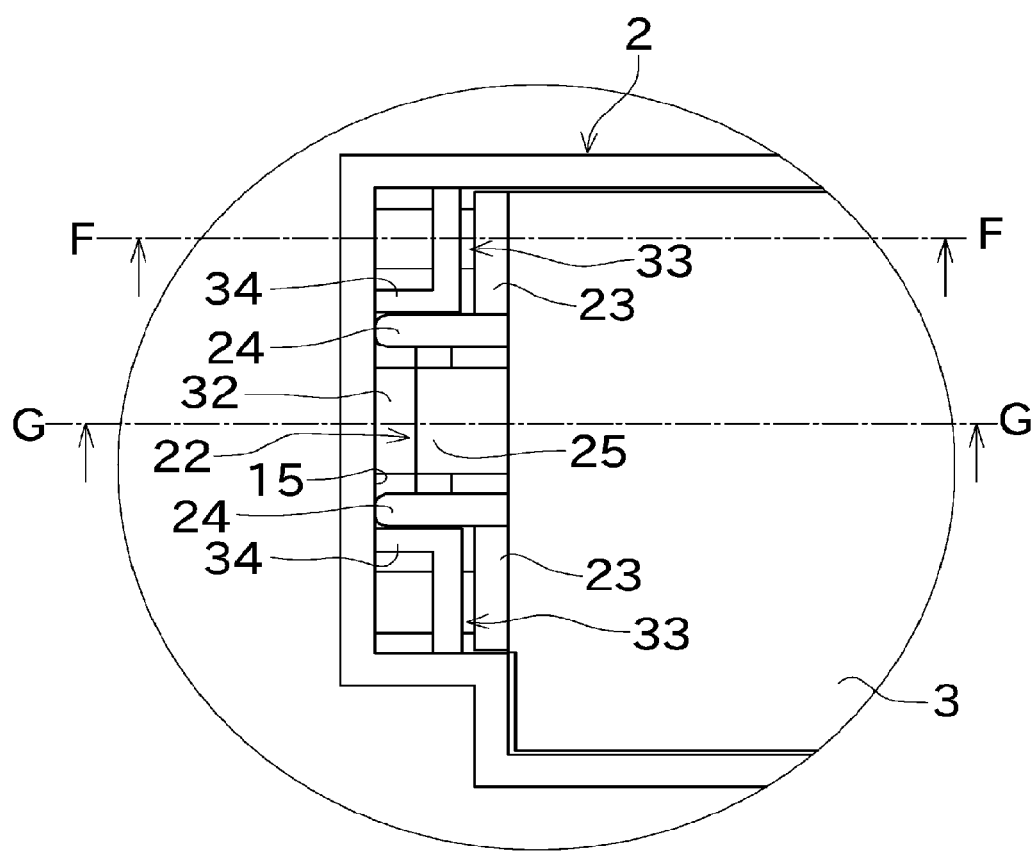
FIG. 11 A plan view showing a state where the relay module is received in the receiving part.

The reception-object engaging portion 20 and the receiving-part engaging portion 21 having the above-described configurations are brought into engagement with each other by insertion of the relay module 3 into the receiving part 2. A state where the relay module 3 is inserted in the receiving part 2 is shown in FIGS. 11 to 13.

Figure 12:
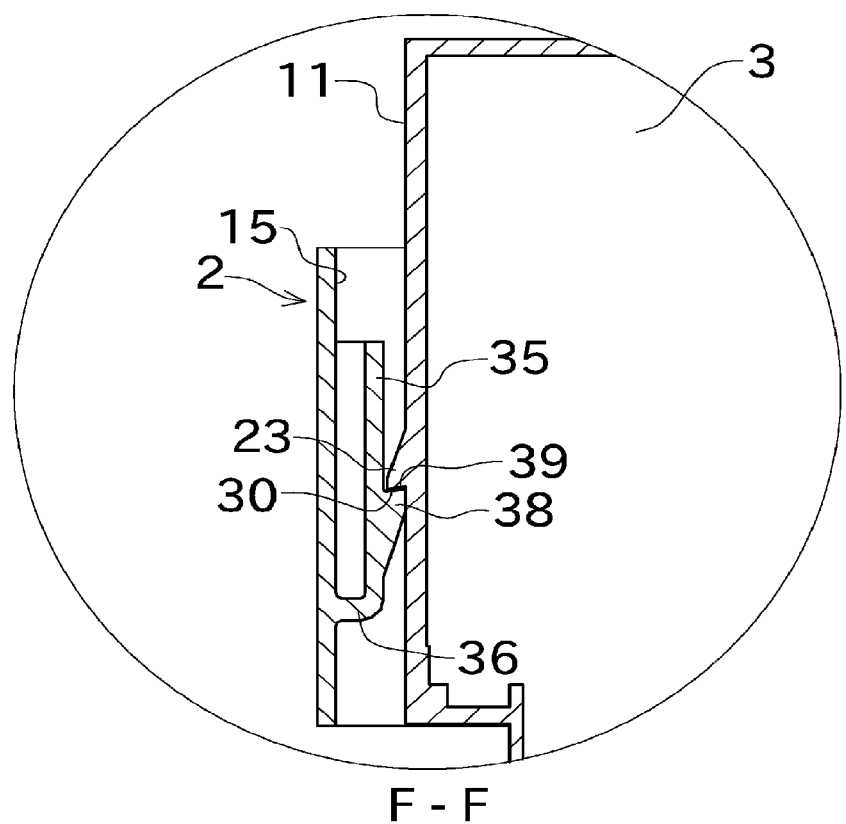
FIG. 12 A cross-sectional view as taken along the line F-F and seen along the arrows of FIG. 11.
Figure 13:
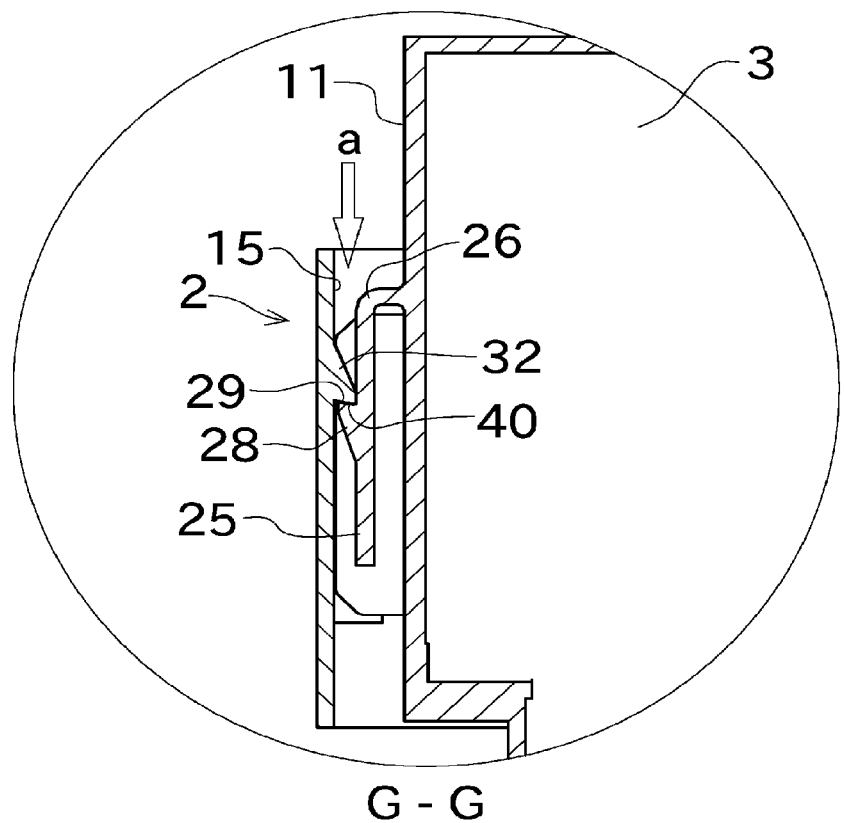
FIG. 13 A cross-sectional view as taken along the line G-G and seen along the arrows in FIG. 11.

As shown in FIG. 12, when the relay module 3 is received in the receiving part 2, the two side elastic latch claws 38 of the receiving part 2 and the two side latch claws 23 of the relay module 3 are engaged with each other.

A more specific description is as follows. In this embodiment, the latch surfaces 39 of the side elastic latch claws 38 face in the first insertion direction (upward in FIG. 12), while the latch surfaces 30 of the side latch claws 23 face in the second insertion direction (downward in FIG. 12). The latch surfaces 30 and the latch surfaces 39 are configured to be in contact with each other when the relay module 3 is received in the receiving part 2 as shown in FIG. 12.

Thus, inserting the relay module 3 into the receiving part 2 in the second insertion direction (downward in FIG. 12) from the upper side (the situation illustrated with the chain line in FIG. 1) brings the latch surfaces 30 and the latch surfaces 39 into contact with each other so that the side elastic latch claws 38 and the side latch claws 23 are engaged with each other (the state shown in FIG. 12). This prevents the relay module 3 from falling out in the second insertion direction (downward in FIG. 12).

On the other hand, inserting the relay module 3 into the receiving part 2 in the first insertion direction from the lower side (the situation illustrated with the solid line in FIG. 1) makes the side latch claws 23 of the relay module 3 push the side elastic latch claws 38 of the receiving part 2 which are thereby elastically moved. This allows the side latch claws 23 to move beyond the side elastic latch claws 38 in the first insertion direction. Once the side latch claws 23 go beyond the side elastic latch claws 38, the latch surfaces 30 and the latch surfaces 39 come into contact with each other so that the side elastic latch claws 38 and the side latch claws 23 are engaged with each other (the state shown in FIG. 12).

Such a configuration in which the side elastic latch claws 38 are elastically movable enables the side elastic latch claws 38 and the side latch claws 23 to be engaged with each other independently of from which side in the insertion direction the relay module 3 is inserted into the receiving part 2. The engagement of the side elastic latch claws 38 with the side latch claws 23 prevents the relay module 3 from falling out of the receiving part 2 in the second insertion direction (downward in FIG. 12).

As shown in FIG. 13, when the relay module 3 is received in the receiving part 2, the central latch claw 32 of the receiving part 2 and the central elastic latch claw 28 of the relay module 3 are engaged with each other.

A more specific description is as follows. In this embodiment, the latch surface 29 of the central elastic latch claw 28 faces in the first insertion direction (upward in FIG. 12), while the latch surface 40 of the central latch claw 32 faces in the second insertion direction (downward in FIG. 12). The latch surface 40 and the latch surface 29 are configured to be in contact with each other when the relay module 3 is received in the receiving part 2 as shown in FIG. 13.

Thus, inserting the relay module 3 into the receiving part 2 in the first insertion direction (upward in FIG. 13) from the lower side (the situation illustrated with the solid line in FIG. 1) brings the latch surface 40 and the latch surface 29 into contact with each other so that the central elastic latch claw 28 and the central latch claw 32 are engaged with each other (the state shown in FIG. 13). This prevents the relay module 3 from falling out in the first insertion direction (upward in FIG. 13).

On the other hand, inserting the relay module 3 into the receiving part 2 in the second insertion direction from the upper side (the situation illustrated with the chain line in FIG. 1) makes the central latch claw 32 of the receiving part 2 push the central elastic latch claw 28 of the relay module 3 which is thereby elastically moved. This allows the central elastic latch claw 28 to move beyond the central latch claw 32 in the second insertion direction. Once the central elastic latch claw 28 goes beyond the central latch claw 32, the latch surface 40 and the latch surface 29 come into contact with each other so that the central elastic latch claw 28 and the central latch claw 32 are engaged with each other (the state shown in FIG. 13).

Such a configuration in which the central elastic latch claw 28 is elastically movable enables the central elastic latch claw 28 and the central latch claw 32 to be engaged with each other independently of from which side in the insertion direction the relay module 3 is inserted into the receiving part 2. The engagement of the central elastic latch claw 28 with the central latch claw 32 prevents the relay module 3 from falling out of the receiving part 2 in the first insertion direction (upward in FIG. 13).

As described above, the reception-object engaging portion 20 and the receiving-part engaging portion 21 of this embodiment can prevent the relay module 3 from falling out of the receiving part 2. In addition, the relay module 3 can be inserted into the receiving part 2 from whichever side thereof.

Elastic movement of the central elastic latch claw 28 can be forcibly caused by inserting, for example, a jig as indicated by the arrow a in FIG. 13. This can release the engagement of the central elastic latch claw 28 with the central latch claw 32, so that the relay module 3 can be taken out from the receiving part 2 in the first insertion direction (upward in FIG. 13).

Next, how the receiving-part ribs 34 and the reception-object ribs 24 function when the relay module 3 is inserted into the receiving part 2 will be described.

As shown in FIG. 11, when the relay module 3 is received in the receiving part 2, the distal ends of the reception-object ribs 24 of the relay module 3 with respect to the long side direction are in contact with the first short-side inner surface 15 of the receiving part 2. This can prevent the relay module 3 from rattling in the direction along the long side (in the horizontal direction in FIG. 11) within the receiving part 2.

Moreover, as shown in FIG. 11, when the relay module 3 is received in the receiving part 2, the exterior surfaces of the reception-object ribs 24 are in contact with the interior surfaces of the receiving-part ribs 34 with respect to the short side direction (with respect to the vertical direction in FIG. 11). This can prevent the relay module 3 from rattling in the direction along the short side (in the vertical direction in FIG. 11) within the receiving part 2.

Such a configuration in which the receiving-part ribs 34 of the receiving part 2 are in contact with the relay module 3 and the reception-object ribs 24 of the relay module 3 are in contact with the receiving part 2 is able to prevent the relay module 3 from rattling within the receiving part 2.

As described above, this embodiment achieves latching and prevents rattling of the relay module 3 received in the receiving part 2 by means of the receiving-part engaging portion 21 provided on each short side of the receiving part 2 and the reception-object engaging portion 20 provided on each short side of the relay module 3. In this embodiment, the configurations (latch claws, ribs, etc.) for fixing the relay module are provided collectively on the short side. The latch claws, etc. are not provided on the long sides of the receiving part 2 and the relay module 3. Accordingly, the receiving part 2 and the relay module 3 can be formed compact with respect to the short side direction.

In this embodiment, particularly, the receiving-part engaging portion 21 is configured such that the central latch claw 32 is arranged in a substantially central region with respect to the short side direction, with the receiving-part ribs 34 arranged on both sides thereof and with the elastic pieces 35 arranged on both further sides thereof, as shown in FIG. 9. This not only allows reasonable arrangement of the latch claw, ribs, and elastic pieces, but also enables without much effort the bridge 37 to be provided between the receiving-part rib 34 and the long-side inner surface (17 or 18) to support the elastic piece 35. In this manner, the receiving-part engaging portion 21 of this embodiment has its configurations arranged collectively, reasonably, and compactly with respect to the short side direction. This is why the receiving-part engaging portion 21 can be arranged on the short side of the receiving part 2.

In this embodiment, the reception-object engaging portion 20 is configured such that the elastic piece 25 is arranged in a substantially central region with respect to the short side direction, with the reception-object ribs 24 arranged on both sides thereof and with the side latch claws 23 arranged on both further sides thereof, as shown in FIG. 6. This not only allows reasonable arrangement of the latch claws, ribs, and elastic piece, but also enables without much effort the bridge 27 to be provided between the two reception-object ribs 24 to support the elastic piece 25. In this manner, the reception-object engaging portion 20 of this embodiment has its configurations arranged collectively, reasonably, and compactly with respect to the short side direction. This is why the reception-object engaging portion 20 can be arranged on the short side of the relay module 3.

Next, actual use of the electrical junction box 1 having the above-described configuration will be briefly described.

To assemble the electrical junction box 1, firstly, a wire harness (not shown) is connected to the connector 4 provided in a lower portion of the relay module 3. This connection of the wire harness to the relay module 3 can be performed with sureness because it is a previously-performed operation.

Then, the relay module 3 with the wire harness connected thereto is received in the receiving part 2. Since the wire harness is connected to the connector 4 provided in the lower portion of the relay module 3, it is impossible to insert the relay module 3 into the receiving part 2 from the upper side thereof (in the second insertion direction). As indicated by the solid-line arrow in FIG. 1, therefore, the relay module 3 is inserted into the receiving part 2 from the lower side thereof (in the first insertion direction).

Thus, the electrical junction box 1 can be assembled.

For example, to perform a maintenance operation on the relay module 3 in the electrical junction box 1, the relay module 3 is pulled upward out of the receiving part 2. As mentioned above, elastic movement of the central elastic latch claw 28 can be forcibly caused by inserting, for example, a jig as indicated by the arrow a in FIG. 13, so that the relay module 3 is pulled out upward. A maintenance operation on the relay module can be easily performed by pulling out the relay module 3 upward.

After completion of the maintenance operation, the relay module 3 is inserted into the receiving part 2 from the upper side thereof (in the second insertion direction) as indicated by the chain-line arrow in FIG. 1. The relay module 3 is thus received in a original position after the maintenance operation.

The receiving part 2 of the this embodiment allows the relay module 3 to be inserted therein in both of the first and second insertion directions. Accordingly, the relay module 3 can be inserted into the receiving part 2 in an appropriate direction depending on the types of operations.

As thus far described, the receiving part 2 of this embodiment allows the relay module 3 having a substantially rectangular parallelepiped shape to be inserted therein in the first insertion direction and in the second insertion direction opposite to the first insertion direction. The receiving part 2 has an opening whose shape is substantially rectangular with short sides and long sides when seen in the insertion direction. The receiving part 2 includes the short-side inner surfaces 15, 16 defining the short sides of the rectangle and the long-side inner surfaces 17, 18 defining the long sides of the rectangle. Each of the short-side inner surfaces 15, 16 of the receiving part 2 is provided with the central latch claw 32 in a substantially central region thereof with respect to the short side direction that is the direction along the short side of the rectangle, and also provided with the side elastic latch portions 33 arranged on both sides of the central latch claw 32 with respect to the short side direction. Each of the side elastic latch portions 33 includes the receiving-part rib 34, the elastic piece 35, and the side elastic latch claw 38. The receiving-part rib 34 protrudes from the short-side inner surface 15 or 16, and extends in the insertion direction. The elastic piece 35 is arranged between the receiving-part rib 34 and the long-side inner surface (17 or 18), and elastically deformable. The side elastic latch claw 38 is formed on the elastic piece 35. The side elastic latch claw 38 has the latch surface 39 that faces in the first insertion direction, and the central latch claw 32 has the latch surface 40 that faces in the second insertion direction. The relay module 3 is fixed by the latch surface 40 of the central latch claw 32, the latch surfaces 39 of the side elastic latch claws 38, and the receiving-part ribs 34 being in contact with the relay module 3.

Providing the side elastic latch claws 38 with the latch surfaces 39 facing in the first insertion direction and the central latch claw 32 with the latch surface 40 facing in the second insertion direction enables the relay module 3 to be fixed so as not to fall out in either of the first insertion direction nor the second insertion direction. The relay module 3 can be inserted into the receiving part 2 in both of the first insertion direction and the second insertion direction. The receiving-part ribs 34 being in contact with the relay module 3 can prevent the relay module from rattling. Since the central latch claw 32 and the side elastic latch portions 33 are arranged side by side along the short side, there is no need to provide a latch claw and the like on the long side. Accordingly, the receiving part 2 can be made compact.

As illustrated above, the receiving part 2 of this embodiment is configured as follows. Each of the side elastic latch portion 33 includes the bridge 37 that connects the receiving-part rib 34 to the long-side inner surface. The elastic piece 35 included in the side elastic latch portion 33 is elongated in the insertion direction. One longitudinal end portion of the elastic piece 35 is connected to the short-side inner surface via the curved portion 36. The other longitudinal end portion of the elastic piece 35 is connected to the bridge 37.

Providing the bridge 37 that connects the receiving-part rib 34 to the long-side inner surface leads to prevention of deformation of the receiving-part rib 34 so that the strength of the receiving-part rib 34 is improved. In addition, the strength of the elastic piece 35 is ensured because the elastic piece 35 is supported in a fixed-fixed manner as mentioned above.

As illustrated above, the electrical junction box 1 of this embodiment includes the above-described receiving part 2.

Such an electrical junction box 1 includes the receiving part 2 with a compact configuration. Accordingly, the electrical junction box 1 as a whole can be configured compactly.

As illustrated above, the electrical junction box 1 of this embodiment is configured as follows. The electrical junction box 1 includes the relay module 3 to be received in the receiving part 2. The relay module 3 has a substantially rectangular shape when seen in the insertion direction, with the short-side outer surfaces 11, 12 defining the short sides of the rectangle and the long-side outer surfaces 13, 14 defining the long sides of the rectangle. Each of the short-side outer surfaces 11, 12 of the relay module 3 is provided with the central elastic latch portion 22 in a substantially central region thereof with respect to the short side direction, and also provided with the side latch claws 23 arranged on both sides of the central elastic latch portion 22 with respect to the short side direction. The central elastic latch portion 22 includes the two reception-object ribs 24, the elastic piece 25, and the central elastic latch claw 28. The reception-object ribs 24 protrude from the short-side outer surface and extend in the insertion direction in parallel to each other. The elastic piece 25 is arranged between the two reception-object ribs 24. The central elastic latch claw 28 is formed on the elastic piece 25. The central elastic latch claw 28 has the latch surface 29 that faces in the first insertion direction, and the side latch claws 23 have the latch surfaces 30 that face in the second insertion direction. The relay module 3 is fixed to the receiving part 2 by: the latch surface 29 of the central elastic latch claw 28 being in contact with the latch surface 40 of the central latch claw 32, and the latch surfaces 39 of the side elastic latch claws 38 being in contact with the latch surfaces 30 of the side latch claws 23; the distal ends of the reception-object ribs 24 being in contact with the short-side inner surface; and the reception-object ribs 24 being in contact with the receiving-part ribs 34 with respect to the short side direction.

The latch claws of the receiving part 2 and the latch claws of the relay module 3 being engaged in this manner enables the relay module 3 to be appropriately fixed. In addition, the distal ends of the ribs of the relay module 3 being in contact with the short-side inner surface of the receiving part 2 can reduce rattling of the relay module 3 with respect to the long side direction. Moreover, the reception-object ribs 24 being in contact with the receiving-part ribs 34 with respect to the short side direction can reduce rattling of the relay module 3 with respect to the short side direction. Accordingly, in the above-described configuration, the mechanism for fixing the relay module 3 and reducing rattling thereof can be collectively and compactly arranged on the short side.

As illustrated above, the electrical junction box 1 of this embodiment is configured as follows. The central elastic latch portion 22 includes the bridge 27 that connects the two reception-object ribs 24 to each other. The elastic piece 25 included in the central elastic latch portion 22 is elongated in the insertion direction. One longitudinal end portion of the elastic piece 25 is connected to the short-side outer surface via the curved portion 26. The other longitudinal end portion of the elastic piece 25 is connected to the bridge 27.

Providing the bridge 27 that connects the two reception-object ribs 24 to each other leads to prevention of deformation of the reception-object ribs 24 so that the strength of the reception-object ribs 24 is improved. In addition, the strength of the elastic piece 25 is ensured because the elastic piece 25 is supported in a fixed-fixed manner.

Next, a variation of the embodiment illustrated above will be described.

Figure 14:
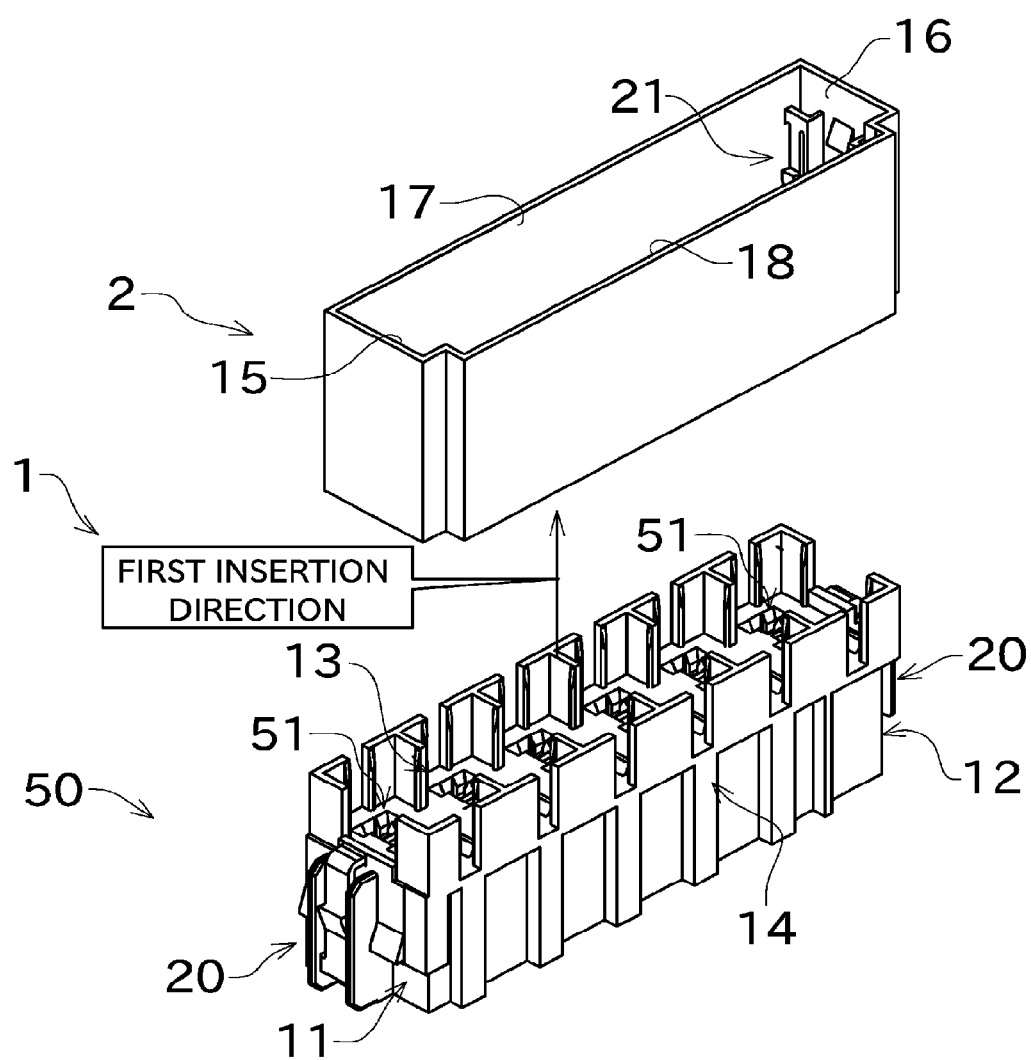
FIG. 14 A perspective view showing a variation.

In the above-described embodiment, the relay module 3 is received in the receiving part 2 of the electrical junction box 1. A reception object to be received in the receiving part 2 is, however, not limited to the relay module 3. For example, FIG. 14 shows a relay cassette 50 being received in the receiving part 2.

The relay cassette 50 is made of a synthetic resin and provided on its upper surface with a relay mount 51 to which a plug-in relay can be mounted and dismounted.

The relay cassette 50 has a substantially rectangular parallelepiped shape that can be inserted into the receiving part 2. That is, when seen in the insertion direction, the relay cassette 50 has a substantially rectangular shape. Like the relay module of the above-described embodiment, the relay cassette 50 includes short-side outer surfaces 11, 12 and long-side outer surfaces 13, 14. The relay cassette 50 includes, on the short-side outer surfaces 11, 12, reception-object engaging portions 20 having the same shapes as those of the above-described embodiment.

The relay cassette 50 can therefore be attached to the receiving part 2, similarly to the relay module 3 of the above-described embodiment. To attach the relay cassette 50 of this type to the receiving part 2, the relay cassette 50 is inserted into the receiving part 2 from the lower side thereof (in the first insertion direction) as shown in FIG. 14.

Since the reception-object engaging portions 20 of the relay cassette 50 of this variation have the same shapes as those of the reception-object engaging portions 20 of the relay module 3 of the above-described embodiment, the relay cassette 50 and the relay module 3 can be considered as compatible in terms of their structure for being attached to the receiving part 2. Accordingly, it is possible to attach the relay module 3 of the above-described embodiment instead of the relay cassette 50 of this variation to the receiving part 2. That is, the relay cassette 50 and the relay module 3 can be selectively attached. This allows either of the relay cassette 50 and the relay module 3 to be flexibly selected as appropriate.

Although a preferred embodiment of the present invention has been described above, the above-described configuration can be modified, for example, as follows.

In the above-described embodiment, the upper direction and the lower direction are defined as the first insertion direction and the second insertion direction, respectively, but the insertion direction is not limited thereto.

The reception object is not limited to the relay module and the relay cassette described above. It suffices that the reception object is configured to be attached to the electrical junction box in a cassette-like manner.

It suffices that the receiving part 2 and the relay module (reception object) 3 are substantially rectangular when seen in the insertion direction, and it is not necessary that they are exactly rectangular. For example, referring to FIG. 3, the receiving part 2 of the above-described embodiment is polygonal in a strict sense, but in this case, short sides and long sides can be recognized. The shape of the receiving part 2 can therefore be considered as a substantially rectangular shape.

It suffices that the reception object has a substantially rectangular parallelepiped shape, and it need not be exactly a rectangular parallelepiped shape. For example, the relay cassette 50 shown in FIG. 14 has quite a complicated shape, but it is able to be received in the receiving part 2 having a substantially rectangular shape, and its short-side surfaces and long-side surfaces can be recognized. The shape of the relay cassette 50 can therefore be considered as a substantially rectangular parallelepiped shape.

DESCRIPTION OF THE REFERENCE NUMERALS 1 electrical junction box
2 receiving part
3 relay module (reception object)
32 central latch claw
33 side elastic latch portion
35 elastic piece
37 bridge
38 side elastic latch claw

The invention claimed is:

1. A receiving part allowing a reception object having a substantially rectangular parallelepiped shape to be inserted therein in a first insertion direction and in a second insertion direction opposite to the first insertion direction,
    the receiving part having an opening whose shape is substantially rectangular with short sides and long sides when seen in the insertion direction, the receiving part including short-side inner surfaces defining the short sides of the rectangle and long-side inner surfaces defining the long sides of the rectangle,
    the short-side inner surface provided with a central latch claw in a substantially central region thereof with respect to a short side direction that is a direction along the short side of the rectangle, the short-side inner surface provided with side elastic latch portions arranged on both sides of the central latch claw with respect to the short side direction,
    the side elastic latch portion including:
        a receiving-part rib protruding from the short-side inner surface and extending in the insertion direction;
        an elastic piece arranged between the receiving-part rib and the long-side inner surface, the elastic piece elastically deformable; and
        a side elastic latch claw formed on the elastic piece,
    the side elastic latch claw having a latch surface that faces in the first insertion direction,
    the central latch claw having a latch surface that faces in the second insertion direction,
    the reception object fixed by the latch surface of the central latch claw, the latch surface of the side elastic latch claw, and the receiving-part rib being in contact with the reception object.

2. The receiving part according to claim 1, wherein
    the side elastic latch portion includes a bridge that connects the receiving-part rib to the long-side inner surface,
    the elastic piece included in the side elastic latch portion is elongated in the insertion direction,
    one longitudinal end portion of the elastic piece is connected to the short-side inner surface via a curved portion, and
    the other longitudinal end portion of the elastic piece is connected to the bridge.

3. An electrical junction box including the receiving part according to claim 1.

4. The electrical junction box according to claim 3, including a reception object to be received in the receiving part, wherein
    the reception object has a substantially rectangular shape when seen in the insertion direction, with short-side outer surfaces defining short sides of the rectangle and long-side outer surfaces defining long sides of the rectangle,
    the short-side outer surface is provided with a central elastic latch portion in a substantially central region thereof with respect to the short side direction, and provided with side latch claws arranged on both sides of the central elastic latch portion with respect to the short side direction,
    the central elastic latch portion includes:
        two reception-object ribs protruding from the short-side outer surface and extending in the insertion direction in parallel to each other;
        an elastic piece arranged between the two reception-object ribs, the elastic piece elastically deformable; and
        a central elastic latch claw formed on the elastic piece,
    the central elastic latch claw has a latch surface that faces in the first insertion direction,
    the side latch claw has a latch surface that faces in the second insertion direction, and
    the reception object is fixed to the receiving part by:
        the latch surface of the central elastic latch claw being in contact with the latch surface of the central latch claw, and the latch surface of the side elastic latch claw being in contact with the latch surface of the side latch claw;
        a distal end of the reception-object rib being in contact with the short-side inner surface; and
        the reception-object rib being in contact with the receiving-part rib with respect to the short side direction.

5. The electrical junction box according to claim 4, wherein
    the central elastic latch portion includes a bridge that connects the two reception-object ribs to each other,
    the elastic piece included in the central elastic latch portion is elongated in the insertion direction,
    one longitudinal end portion of the elastic piece is connected to the short-side outer surface via a curved portion, and
    the other longitudinal end portion of the elastic piece is connected to the bridge.

* * * * *